United States Patent
Hong et al.

(10) Patent No.: US 9,857,845 B2
(45) Date of Patent: Jan. 2, 2018

(54) FLEXIBLE ELECTRONIC DEVICE

(71) Applicant: Samsung Display Co., Ltd., Yongin-si (KR)

(72) Inventors: Jung-moo Hong, Seoul (KR); Kyuyoung Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 42 days.

(21) Appl. No.: 15/141,356

(22) Filed: Apr. 28, 2016

(65) Prior Publication Data

US 2017/0083052 A1     Mar. 23, 2017

(30) Foreign Application Priority Data

Sep. 21, 2015   (KR) .................. 10-2015-0133408

(51) Int. Cl.
*G06F 3/041* (2006.01)
*G06F 1/16* (2006.01)
(Continued)

(52) U.S. Cl.
CPC .............. *G06F 1/1652* (2013.01); *B32B 7/02* (2013.01); *G06F 1/1643* (2013.01); *G06F 3/041* (2013.01);
(Continued)

(58) Field of Classification Search
USPC .......... 345/173, 174, 156; 156/182; 359/291
See application file for complete search history.

(56) References Cited

U.S. PATENT DOCUMENTS

| 8,920,904 B2* | 12/2014 | Matsumoto | G06F 3/044 156/182 |
| 2008/0239455 A1* | 10/2008 | Kogut | G02B 26/001 359/291 |

(Continued)

FOREIGN PATENT DOCUMENTS

| EP | 2840460 | 2/2015 |
| JP | 2011-138711 | 7/2011 |

(Continued)

OTHER PUBLICATIONS

European Search Report dated Feb. 6, 2017, in European Patent Application No. 16182211.9.

*Primary Examiner* — Thuy Pardo
(74) *Attorney, Agent, or Firm* — H.C. Park & Associates, PLC

(57) ABSTRACT

A flexible electronic device includes a base substrate and first and second lines disposed thereon. The first and second lines extend in a first direction and are arranged in a second direction. Each of the first and second lines includes a first conductive layer including first and second portions alternately disposed with each other, and second conductive layers respectively overlapped with the first portions in a third direction substantially perpendicular to the first and second directions. The second conductive layer are not overlapped with the second portions of the first conductive layer in the third direction. The first and second conductive layers have a first modulus and a second modulus, respectively. A first width in the second direction of each of the first portions is smaller than a second width in the second direction of each of the second portions.

21 Claims, 9 Drawing Sheets

(51) Int. Cl.
    *H01L 51/52*     (2006.01)
    *H01L 27/32*     (2006.01)
    *G06F 3/047*     (2006.01)
    *G06F 3/044*     (2006.01)
    *B32B 7/02*     (2006.01)

(52) U.S. Cl.
    CPC .............. *G06F 3/044* (2013.01); *G06F 3/047* (2013.01); *H01L 27/323* (2013.01); *H01L 27/3279* (2013.01); *H01L 51/52* (2013.01); *G06F 2203/04102* (2013.01); *H01L 2251/5338* (2013.01); *Y10S 977/762* (2013.01)

(56) References Cited

U.S. PATENT DOCUMENTS

| | | | |
|---|---|---|---|
| 2014/0132553 A1 | 5/2014 | Park et al. | |
| 2014/0299365 A1 | 10/2014 | Sebastian et al. | |
| 2014/0300574 A1 | 10/2014 | Benkley, III et al. | |
| 2015/0022732 A1 | 1/2015 | Park | |
| 2015/0261332 A1* | 9/2015 | Nakamura | G06F 3/0412 345/173 |
| 2015/0301659 A1 | 10/2015 | Umemoto | |
| 2016/0011691 A1* | 1/2016 | Shinkai | G06F 3/044 345/174 |
| 2016/0026297 A1* | 1/2016 | Shinkai | G06F 3/044 345/174 |
| 2016/0048171 A1 | 2/2016 | Lee et al. | |
| 2016/0048207 A1* | 2/2016 | van der Avoort | G06F 3/016 345/174 |
| 2016/0103545 A1* | 4/2016 | Filiz | G01L 1/18 345/174 |
| 2016/0147352 A1* | 5/2016 | Filiz | G01L 1/18 345/173 |
| 2016/0342081 A1 | 11/2016 | Park et al. | |
| 2016/0378241 A1* | 12/2016 | Park | G03F 7/0002 345/173 |

FOREIGN PATENT DOCUMENTS

| | | |
|---|---|---|
| KR | 10-2014-0062269 | 5/2014 |
| KR | 10-2014-0072131 | 6/2014 |
| KR | 10-2014-0099164 | 8/2014 |
| KR | 10-2014-0126369 | 10/2014 |
| KR | 10-2015-0009291 | 1/2015 |
| KR | 10-2015-0095595 | 8/2015 |

\* cited by examiner

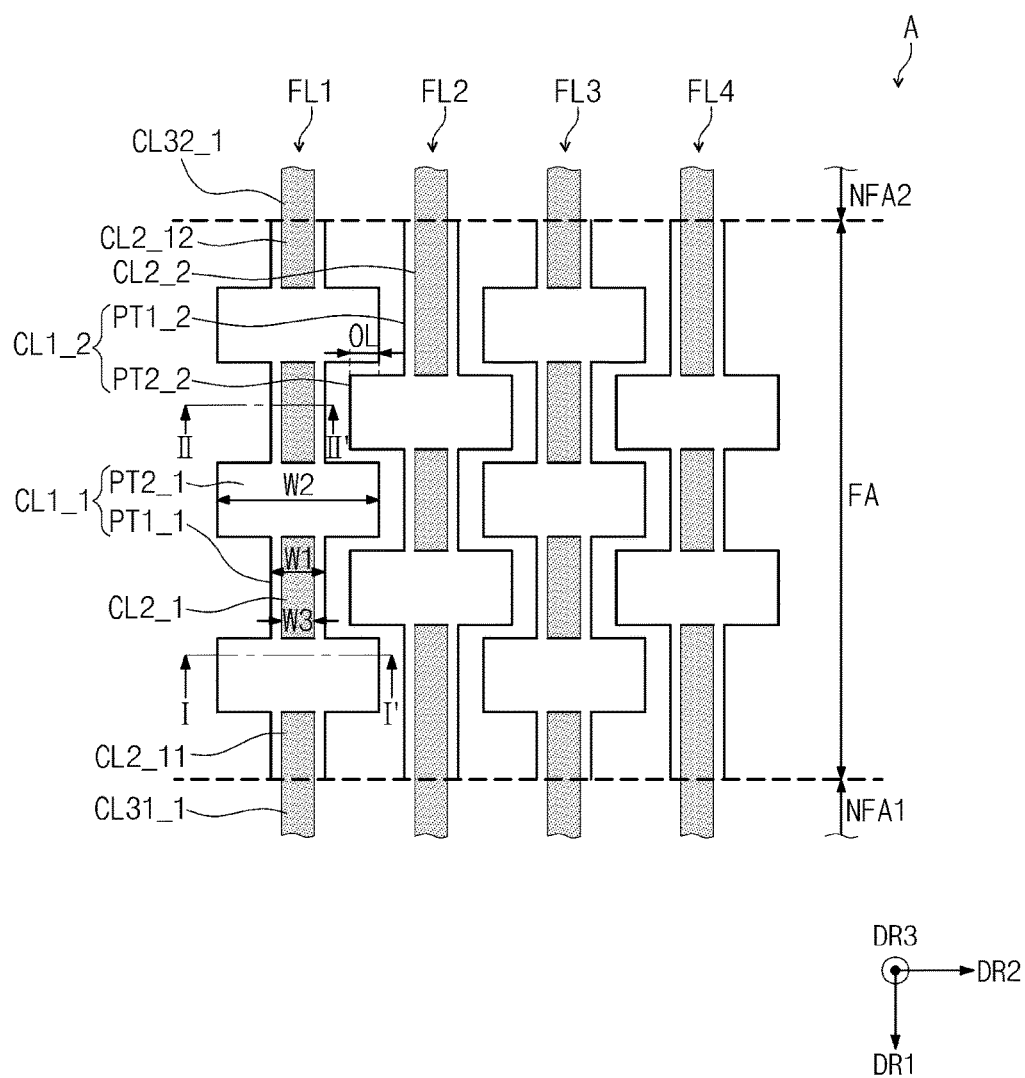

FLEXIBLE ELECTRONIC DEVICE

CROSS-REFERENCE TO RELATED APPLICATION

This application claims priority from and the benefit of Korean Patent Application No. 10-2015-0133408, filed on Sep. 21, 2015, which is hereby incorporated by reference for all purposes as if fully set forth herein.

BACKGROUND

Field

Exemplary embodiments relate to a flexible electronic device. More particularly, exemplary embodiments relate to a flexible electronic device including a touch panel.

Discussion of the Background

Various display devices used for a multimedia device, such as a television set, a mobile phone, a tablet computer, a navigation system, a game unit, etc., have been developed. As an input device for display devices, a keyboard or a mouse is used. In addition, display devices may include a touch panel as an input device.

A display device may be formed to have various shapes, as compared to a flat panel display device. For instance, various flexible display devices, e.g., a curved display device, a bent display device, a foldable display device, a rollable display device, etc., have been developed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a flexible electronic device having improved reliability.

Additional aspects will be set forth in the detailed description which follows, and, in part, will be apparent from the disclosure, or may be learned by practice of the inventive concept.

According to an exemplary embodiment of the present invention, a flexible electronic device includes a base substrate and first and second lines disposed on the base substrate. The first and second lines extend in a first direction and are arranged in a second direction different from the first direction. Each of the first and second lines includes a first conductive layer including first portions and second portions alternately disposed with the first portions, and second conductive layers respectively overlapped with the first portions of the first conductive layer in a third direction substantially perpendicular to the first and second directions. The second conductive layer are not overlapped with the second portions of the first conductive layer in the third direction. The first and second conductive layers have a first modulus and a second modulus, respectively. A first width in the second direction of each of the first portions of the first conductive layer is smaller than a second width in the second direction of each of the second portions of the first conductive layer.

According to an exemplary embodiment of the present invention, a flexible electronic device includes a base substrate and a line disposed on the base substrate. The lines extends in a first direction and is curved with respect to a folding axis substantially parallel to a second direction different from the first direction. The line includes a first conductive layer having a first modulus and a second conductive layer having a second modulus different from the first modulus. The first conductive layer includes a first portion having a first width in the second direction and a second portion extending from the first portion in the first direction and having a second width less than the first width in the second direction. The second conductive layer is overlapped with the first portion of the first conductive layer in a third direction substantially perpendicular to the first and second directions and not overlapped with the second portion of the first conductive layer in the third direction.

According to exemplary embodiments of the present invention, a first modulus of a first conductive layer is less than a second modulus of a second conductive layer, such that a line including the first and second conductive layers may have improved flexibility and the resistance per the unit length, as the second conductive layer has a conductivity higher than that of the first conductive layer. The second conductive layer is disposed to correspond to a first portion of the first conductive layer, to prevent a crack occurring in the second conductive layer when the line is being curved, which may improve reliability and electrical characteristics of the line.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 5A is an enlarged plan view of portion A of FIG. 4.

DETAILED DESCRIPTION OF THE ILLUSTRATED EMBODIMENTS

Figure 1:
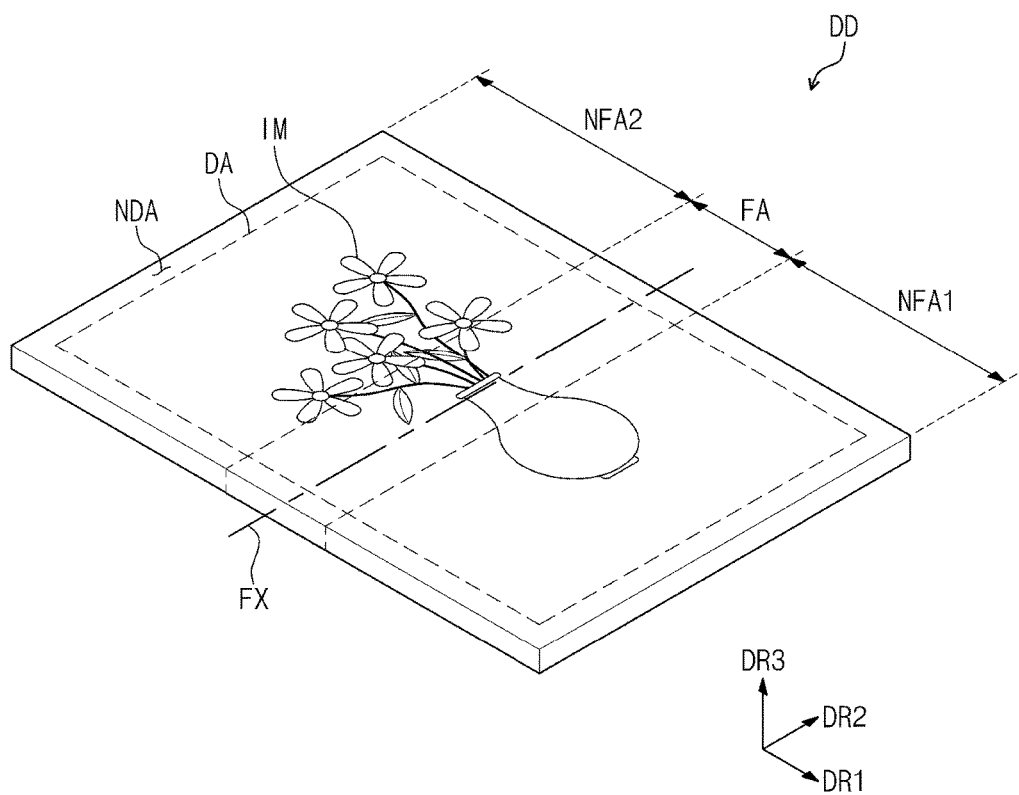
FIG. 1 is a perspective view showing a flexible display device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As described herein, a flexible electronic device may be electronic devices, e.g., a flexible display panel, a flexible touch panel, a flexible solar panel, etc., which may be stably operated while the flexible electronic device is being bent by an external force. The flexible electronic device includes lines configured to apply an electric power and/or an electrical signal to components disposed therein. Hereinafter, for convenience of description, the flexible electronic device will be described with reference to a flexible display device DD.

FIG. 1 is a perspective view showing a flexible display device DD according to an exemplary embodiment of the present invention.

In the present exemplary embodiment, a flexible display device DD (hereinafter, referred to as a display device) will be described with reference to a foldable display device. The display device DD may include a curved display device, a bent display device, a rollable display device, or a stretchable display device. The display device DD may be applied to a large-sized electronic device, such as a television set, an outdoor billboard, etc., and a small and medium-sized electronic device, such as a personal computer, a notebook computer, a personal digital assistants, a navigation unit, a game unit, a mobile electronic device, a wrist-type electronic device, a camera, etc., but it should not be limited thereto or thereby.

Referring to FIG. 1, a display surface on which an image IM is displayed is substantially parallel to a first direction DR1 and a second direction DR2. A normal line direction of the display surface is substantially parallel to a third direction DR3. That is, the third direction DR3 is substantially perpendicular to the first and second directions DR1 and DR2. The third direction DR3 indicates a thickness direction of the flexible display device DD. Front and rear surfaces of each constituting element of the flexible display device DD may be illustrated with reference to the third direction DR3.

The display device DD includes a display area DA (hereinafter, may be referred to as an active area) and a non-display area NDA (hereinafter, may be referred to as a non-active area). The display device DD may display the image IM through the display area DA. The non-display area NDA may not display the image IM. A driver and/or lines configured to drive the display area DA are disposed in the non-display area NDA. FIG. 1 shows an image of a vase as the image IM. The non-display area NDA surrounds the display area DA. The shape of the display area DA may be, for example, substantially quadrangular.

The display device DD includes a folding area FA and first and second non-folding areas NFA1 and NFA2. The folding area FA may be curved by an external force applied thereto, and the first and second non-folding areas NFA1 and NFA2 may not be curved by the external force. The folding area FA is interposed between the first and second non-folding areas NFA1 and NFA2. The folding area FA is curved with respect to a folding axis FX substantially parallel to the second direction DR2. According to exemplary embodiments of the present invention, the second non-folding area NFA2 may be omitted.

Figure 2A:
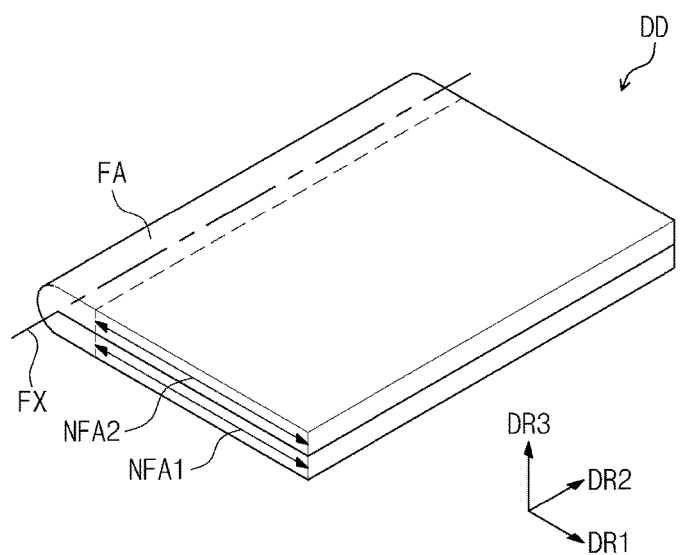
FIG. 2A is a perspective view showing a display device according to an exemplary embodiment of the present invention.
Figure 2B:
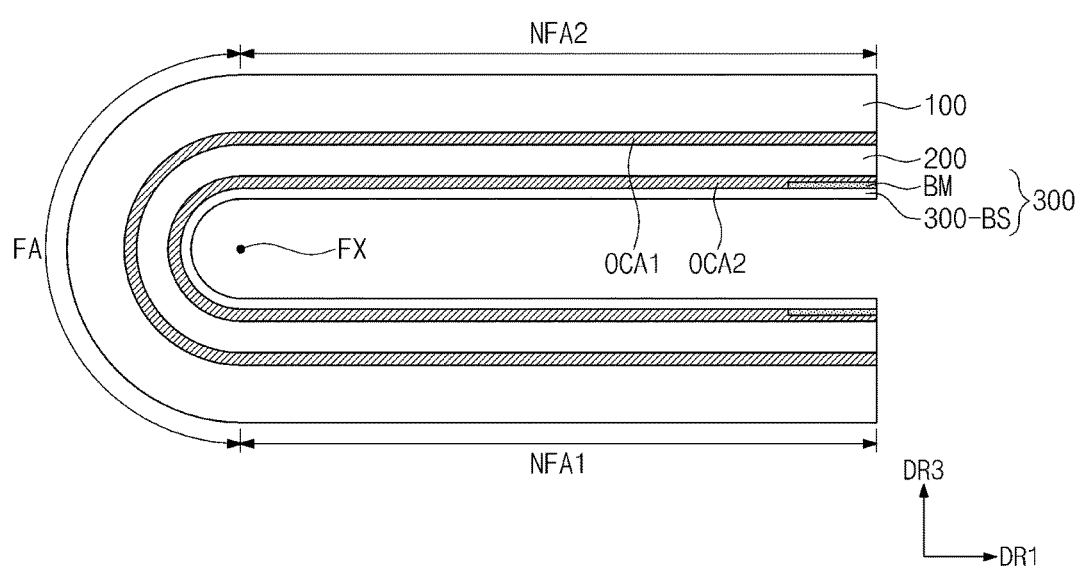
FIG. 2B is a cross-sectional view showing a display device according to an exemplary embodiment of the present invention.

FIG. 2A is a perspective view showing a display device DD according to an exemplary embodiment of the present invention. FIG. 2B is a cross-sectional view showing a display device DD according to an exemplary embodiment of the present invention.

Referring to FIG. 2A, the display device DD may be folded along the folding axis FX, such that a display surface of the first non-folding area NFA1 may face a display surface of the second non-folding area NFA2. Hereinafter, a folding state, in which the display device DD is folded to have the display surface of the first non-folding area NFA1 face the display surface of the second non-folding area NFA2, is referred to as an inner folding. In the present exemplary embodiment, when the first folding area NFA1 is rotated in a clockwise direction with respect to the folding axis FX, the display device DD is in the inner folding state.

The display device DD may be folded along the folding axis FX in a counter-clockwise direction, such that the display surfaces of the first and second non-folding areas NFA1 and NFA2 face outside of the display device DD. Hereinafter, the folding state, in which the display device DD is folded to have the display surfaces of the first and second non-folding areas NFA1 and NFA2 face outside of the display device DD, is referred to as an outer folding.

Referring to FIG. 2B, the display device DD includes a display panel 100, a touch panel 200, and a window member 300. The display device DD may further includes a protective member (not shown) attached to a front surface of the window member 300, to protect the display panel 100 and the touch panel 200. Each of the display panel 100, the touch panel 200, and the window member 300 may be flexible.

The display panel 100 may display an image IM (refer to FIG. 1) corresponding to image data applied thereto. The display panel 100 may be a liquid crystal display panel, an organic light emitting display panel, an electrophoretic display panel, or an electrowetting display panel, etc. In the present exemplary embodiment, the display panel 100 will be described with reference to an organic light emitting display panel. Since operations and configurations of an organic light emitting display panel are generally known in the art, detailed description thereof will be omitted to avoid obscuring exemplary embodiments described herein.

The touch panel 200 may obtain coordinate information of an input position. The touch panel 200 may be disposed on an entire surface of the display panel 100. The touch panel 200 is interposed between the window member 300 and the display panel 100. Relative positions of the display panel 100 and the touch panel 200 may be varied. The touch panel 200 may be a contact or a contactless type touch panel. Detailed description of the touch panel 200 will be described with reference to FIGS. 4 and 7.

The window member 300 includes a base member 300-BS and a black matrix BM. The black matrix BM is interposed between the base member 300-BS and the touch panel 200, and defines a bezel area of the display device DD (e.g., the non-display area NDA of FIG. 1). The black matrix BM may be formed by, for example, a coating method using a colored organic layer.

The base member 300-BS may include a glass substrate, a sapphire substrate, or a plastic film. The window member 300 may further include a functional coating layer (not shown) disposed on the entire surface of the base member 300-BS. The functional coating layer may include an anti-fingerprint layer (not shown), an anti-reflection layer (not shown), and a hard coating layer (not shown).

The display panel 100 and the touch panel 200 are coupled to each other by an optically clear adhesive film OCA1. The touch panel 200 and the window member 300 are coupled to each other by an optically clear adhesive film OCA2. According to an exemplary embodiment of the present invention, one of the two optically clear adhesive films OCA1 and OCA2 may be omitted. For instance, the display panel 100 and the touch panel 200 may be manufactured through successive processes, and, thus, the touch panel 200 may be directly disposed on the display panel 100.

Figure 3:
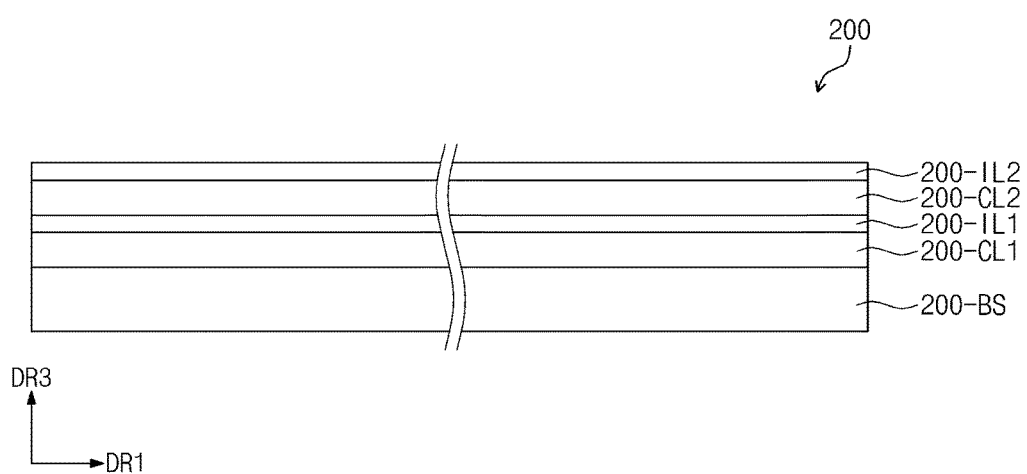
FIG. 3 is a cross-sectional view showing a touch panel according to an exemplary embodiment of the present invention.
Figure 4:
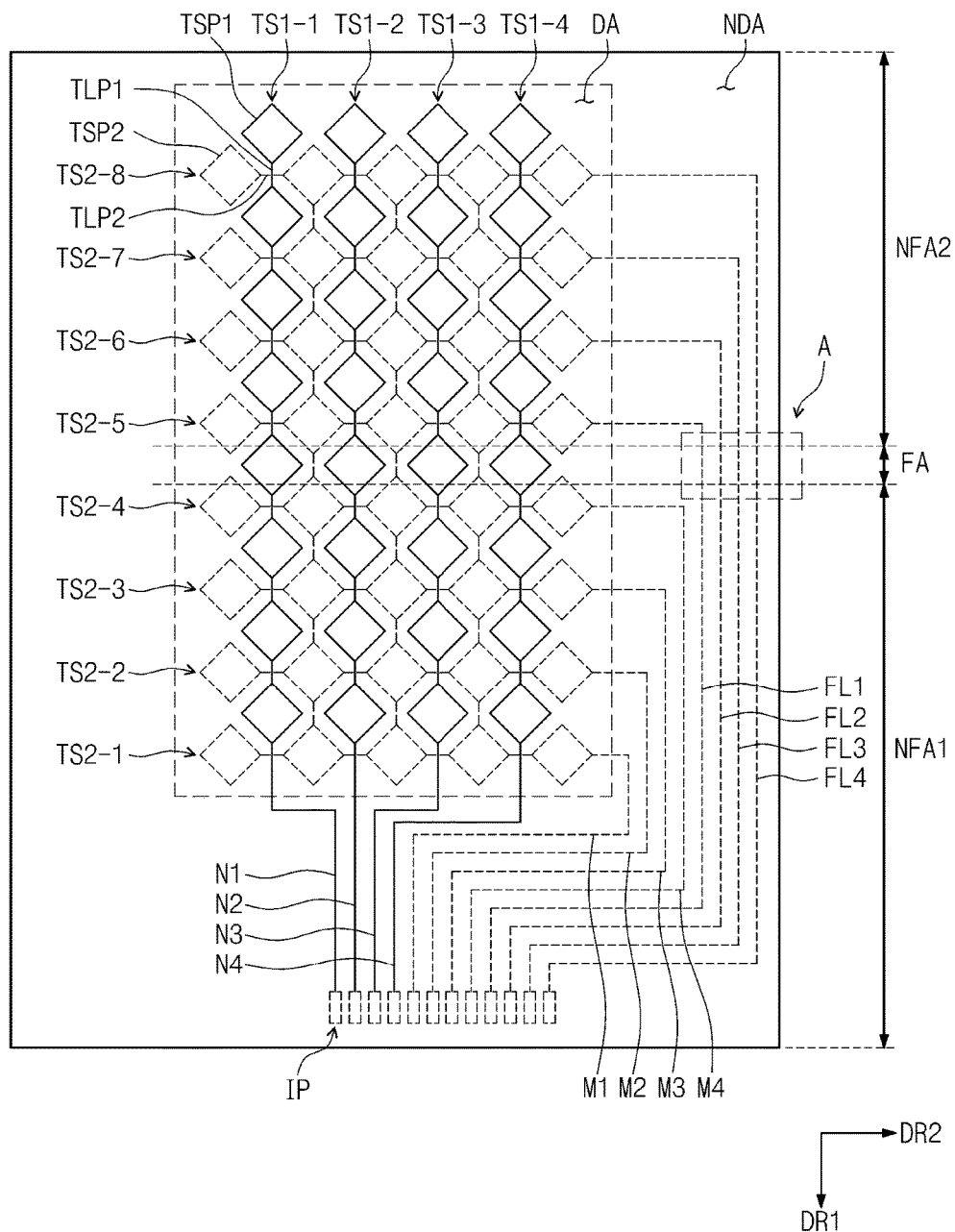
FIG. 4 is a plan view showing a touch panel according to an exemplary embodiment of the present invention.

FIG. 3 is a cross-sectional view showing a touch panel 200 according to an exemplary embodiment of the present invention. FIG. 4 is a plan view showing a touch panel 200 according to an exemplary embodiment of the present invention.

Referring to FIG. 3, the touch panel 200 includes a base substrate 200-BS, a first conductive layer 200-CL1, a first insulating layer 200-IL1, a second conductive layer 200-CL2, and a second insulating layer 200-IL2. In the present exemplary embodiment, the first conductive layer 200-CL1, the first insulating layer 200-IL1, the second conductive layer 200-CL2, and the second insulating layer 200-IL2 are sequentially stacked on the base substrate 200-BS.

The touch panel 200 may be an electrostatic capacitive type touch panel, but it should not be limited thereto or thereby, as long as the touch panel 200 includes two types of sensors crossing each other. An electrostatic capacitive type touch panel may obtain the coordinate information of the touch position by a self-capacitance manner or a mutual capacitance manner.

The first conductive layer 200-CL1 may include a transparent conductive oxide, e.g., indium tin oxide (ITO), indium zinc oxide (IZO), zinc oxide (ZnO), indium tin zinc oxide (ITZO), etc. The first conductive layer 200-CL1 may include molybdenum, silver, titanium, copper, aluminum, and an alloy thereof. The first conductive layer 200-CL1 may include at least one of a conductive polymer, a metal nano-wire, and a graphene. The first conductive layer 200-CL1 may include a first layer including one of the above-mentioned materials, a second layer including another one of the above-mentioned materials, or more layers.

The first conductive layer 200-CL1 includes conductive patterns disposed on one surface of the base substrate 200-BS. The conductive patterns may form touch sensors, which will be further described with reference to FIGS. 4 and 7.

The first insulating layer 200-IL1 may protect the conductive patterns or insulate a portion of the conductive patterns from the other portion of the conductive patterns. The first insulating layer 200-IL1 includes an inorganic layer or an organic layer. The first insulating layer 200-IL1 has a multi-layer structure of at least one inorganic layer and at least one organic layer.

The second conductive layer 200-CL2 includes a transparent conductive oxide. The second conductive layer 200-CL2 has a single-layer structure or a multi-layer structure. The second conductive layer 200-CL2 includes conductive patterns. The conductive patterns may form touch sensors, which will be further described with reference to FIGS. 4 and 7.

The second insulating layer 200-IL2 may protect the second conductive layer 200-CL2. The second insulating layer 200-IL2 includes an inorganic layer or an organic layer. The second insulating layer 200-IL2 has a multi-layer structure of at least one inorganic layer and at least one organic layer. According to an exemplary embodiment of the present invention, the second insulating layer 200-IL2 may be omitted. In addition, relative positions of the first and second conductive layers 200-CL1 and 200-CL2 may be varied.

Referring to FIG. 4, the touch panel 200 includes first touch sensors TS1-1, TS1-2, TS1-3, and TS1-4 formed on the first conductive layer 200-CL1, and second touch sensors TS2-1, TS2-2, TS2-3, TS2-4, TS2-5, TS2-6, TS2-7, and TS2-8 formed on the second conductive layer 200-CL2.

The first touch sensors TS1-1 to TS1-4 extend in the first direction DR1 and are arranged in the second direction DR2. The second touch sensors TS2-1 to TS2-8 extend in the second direction DR2 and are arranged in the first direction DR1. The second touch sensors TS2-1 to TS2-8 are insulated from the first touch sensors TS1-1 to TS1-4. The first touch sensors TS1-1 to TS1-4 and the second touch sensors TS2-1 to TS2-8 are disposed in the display area DA.

The first touch sensors TS1-1 to TS1-4 include first sensor patterns TSP1 arranged in the first direction DR1 and first connection patterns TLP1 connecting two adjacent first sensor patterns TSP1 in the first direction DR1. The first sensor patterns TSP1 may be integrally formed with the first connection patterns TLP1. The first sensor patterns TSP1 and the first connection patterns TLP1 have a mesh shape.

The second touch sensors TS2-1 to TS2-8 include second sensor patterns TSP2 arranged in the second direction DR2 and second connection patterns TLP2 connecting two adjacent second sensor patterns TSP2 in the second direction DR2. The second sensor patterns TSP2 may be integrally formed with the second connection patterns TLP2. The second sensor patterns TSP2 and the second connection patterns TLP2 have a mesh shape. The second connection patterns TLP2 are insulated from corresponding first connection patterns TLP1 while crossing the corresponding first connection patterns TLP1.

The touch panel 200 includes lines disposed on the base substrate 200-BS disposed in the non-display area NDA. The lines include non-folding lines and folding lines. At least a portion of the non-folding lines may not be disposed in the folding area FA. At least a portion of the folding lines may be disposed in the folding area FA. Accordingly, at least the portion of the folding lines, which is disposed in the folding area FA, may be curved with respect to the folding axis FX (refer to FIG. 2A).

The non-folding lines include first non-folding lines N1, N2, N3, and N4 and second non-folding lines M1, M2, M3, and M4. One end of each of the first non-folding lines N1 to N4 is respectively connected to a corresponding first touch sensor of the first touch sensors TS1-1 to TS1-4, and the other end of each of the first non-folding lines N1 to N4 is respectively connected to a corresponding input pad of input pads IP disposed at a lower portion of the non-display area NDA. The first non-folding lines N1 to N4 are connected to a touch driver (not shown) through the input pads IP. The first non-folding lines N1 to N4 may receive a driving signal from the touch driver to drive the first touch sensors TS1-1 to TS1-4 or receive a touch signal from the first touch sensors TS1-1 to TS1-4.

One end of each of the second non-folding lines M1 to M4 is respectively connected to a corresponding second touch sensor of the second touch sensors TS2-1 to TS2-4, and the other end of each of the second non-folding lines M1 to M4 is respectively connected to a corresponding input pad of the input pads IP. The second non-folding lines M1 to M4 may receive a driving signal from the touch driver to drive the second touch sensors TS2-1 to TS2-4 or receive a touch signal from the second touch sensors TS2-1 to TS2-4.

The folding lines include first, second, third, and fourth folding lines FL1, FL2, FL3, and FL4. One end of each of the first to fourth folding lines FL1 to FL4 is respectively connected to the input pads IP. The other end of each of the first to fourth folding lines FL1 to FL4 extends to the folding area FA and the second non-folding area NFA2, and is connected to corresponding second touch sensors TS2-5 to TS2-8, respectively. The first to fourth folding lines FL1 to FL4 may receive a driving signal from the touch driver to drive the second touch sensors TS2-5 to TS2-8, or receive a touch signal from the second touch sensors TS2-5 to TS2-8.

Figure 5B:
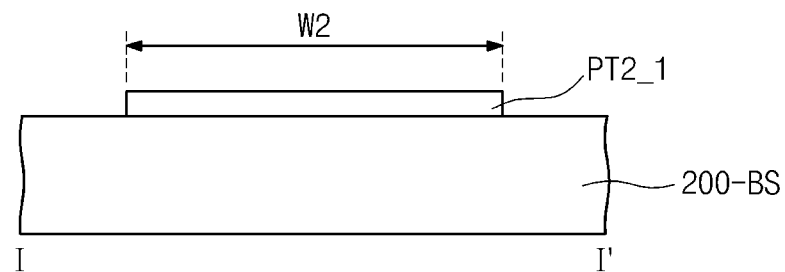
FIG. 5B is a cross-sectional view taken along line I-I' of FIG. 5A.
Figure 5C:
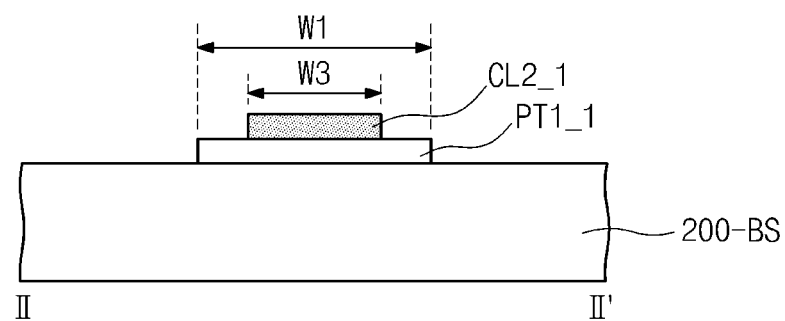
FIG. 5C is a cross-sectional view taken along line II-II' of FIG. 5A.

FIG. 5A is an enlarged plan view showing portion A shown in FIG. 4. FIG. 5B is a cross-sectional view taken along line I-I' of FIG. 5A. FIG. 5C is a cross-sectional view taken along line II-II' of FIG. 5A.

Referring to FIGS. 5A, 5B, and 5C, the first folding line FL1 includes a first conductive layer CL1_1, second conductive layers CL2_1, and a third conductive layer.

The first conductive layer CL1_1 includes first portions PT1_1 and second portions PT2_1. The first portions PT1_1 and the second portions PT2_1 are alternately arranged along the first direction DR1. The first portions PT1_1 and the second portions PT2_1 are disposed on the base substrate 200-BS corresponding to the folding area FA, and may not be disposed on the base substrate 200-BS corresponding to the first and second non-folding areas NFA1 and NFA2. For example, the first portion PT1_1/the second portion PT2_1/the first portion PT1_1/the second portion PT2_1/the first portion PT1_1/the second portion PT2_1/the first portion PT1_1 are sequentially arranged in the folding area FA along the first direction DR1.

Figure 6:
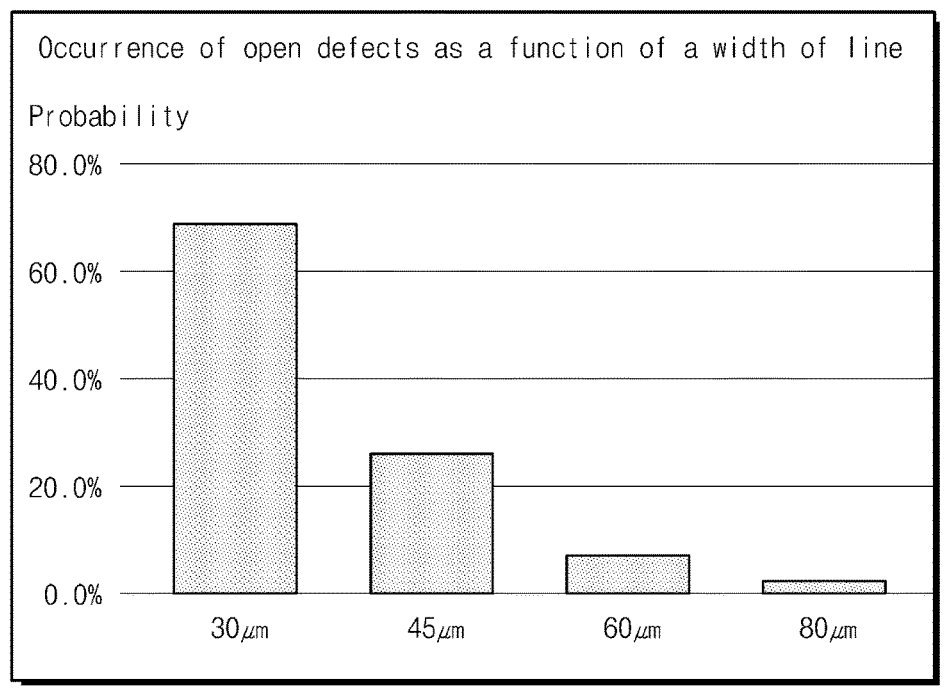
FIG. 6 is a graph showing a probability of occurrence of open defects as a function of a width of line.

Each of the first portions PT1_1 has a first width W1 in the second direction DR2 and each of the second portions PT2_1 has a second width W2 in the second direction DR2. According to the present exemplary embodiment, the first width W1 may be narrower than the second width W2. The first conductive layer CL1_1 may include a metal nano-wire, e.g., a silver nano-wire. In this case, a probability of occurrence of open defects on a line may depend on a width of the line, as shown in FIG. 6. As used herein, the term "open defects" may refer to a state in which a network between the metal nano-wires is partially broken. As such, open defects occurring in a line may substantially increase the resistance thereof.

FIG. 6 is a graph showing a probability of occurrence of open defects as a function of a width of line. In FIG. 6, x-axis plots the width of the line and y-axis plots the probability of occurrence of the open defects.

Referring to FIG. 6, when the width of the line is less than about 30 micrometers, the probability of occurrence of the open defects in the line is substantially increased. When the width of the line is greater than about 30 micrometers, the probability of occurrence of the open defects in the line is substantially decreased.

According to the present exemplary embodiment, the second width W2 may be greater than about 30 micrometers and the first width W1 may be in a range from about 1 micrometers to about 30 micrometers. In detail, the second width W2 may be about 30 micrometers and the first width W1 may be about 10 micrometers. Accordingly, the probability of occurrence of open defects in the first portions PT1_1 from the first portions PT1_1 being curved (or bent) is higher than the probability of occurrence of open defects in the second portions PT2_1 from the second portions TP2_1 being curved.

Referring back to FIGS. 5A to 5C, the second conductive layers CL2_1 are disposed to correspond to the first portions PT1_1 of the first conductive layer CL1_1. In more detail, each of the second conductive layers CL2_1 is overlapped with the first portions PT1_1 in the third direction DR3, and may not overlap the second portions PT2_1 in the third direction DR3. Each of the second conductive layers CL2_1 has a third width W3 less than the first width W1 of the first portions PT1_1.

Referring to FIG. 5B, the second portion PT2_1 is disposed on the base substrate 200-BS, and the second conductive layer CL2_1 may not be disposed on the second portions PT2_1. As shown in FIG. 5C, the first portion PT1_1 is disposed on the base substrate 200-BS and the second conductive layer CL2_1 is disposed on the first portions PT1_1.

Each second conductive layer CL2_1 may be a line including a metal material, e.g., silver, aluminum, copper, etc. As described above, the first conductive layer CL1_1 may include a metal nano-wire, but it should not be limited thereto or thereby. For example, when a first modulus of the first conductive layer CL1_1 is less than a second modulus of the second conductive layers CL2_1, and a first resistance per unit length of the first conductive layer CL1_1 is greater (or higher) than a second resistance per unit length of the second conductive layers CL2_1, a combination of materials for the first conductive layer CL1_1 and the second conductive layer CL2_1 may be various. In addition, a flexibility of the first conductive layer CL1_1 may be greater than a flexibility of the second conductive layers CL2_1.

The first conductive layer CL1_1 has a first yield strength greater than a second yield strength of the second conductive layer CL2_1. When the folding area FA is curved or bent, and a stress equal to or smaller than the first yield strength and equal to or greater than the second yield strength is applied in the first and second conductive layers CL1_1 and CL2_1, crack may occur in the second conductive layer CL2_1, but may not occur in the first conductive layer CL1_1.

The third conductive layer of the first folding line FL1 includes an input third conductive layer CL31_1 and an output third conductive layer CL32_1. The input third conductive layer CL31_1 is substantially parallel to the first direction DR1 and disposed in the first non-folding area NFA1. The output third conductive layer CL32_1 is substantially parallel to the first direction DR1 and disposed in the second non-folding area NFA2. The input third conductive layer CL31_1 is connected to the input pad IP (refer to FIG. 4) disposed in the first non-folding area NFA1. The output third conductive layer CL32_1 is connected to a corresponding second touch sensor of the second touch sensors TS2_5 to TS2_8 (refer to FIG. 4) disposed in the display area DA corresponding to the second non-folding area NFA2.

Among the second conductive layers CL2_1 of the first folding line FL1, an edge second conductive layer CL2_11 disposed most adjacent to the first non-folding area NFA1 extends to the first non-folding area NFA1, and is connected to the input third conductive layer CL31_1. Accordingly, the edge second conductive layer CL2_11 connects the first conductive layer CL1_1 of the first folding line FL1 and the input third conductive layer CL31_1. Among the second conductive layers CL2_1 of the first folding line FL1, an edge second conductive layer CL2_12 disposed most adjacent to the second non-folding area NFA2 extends to the second non-folding area NFA2, and is connected to the output third conductive layer CL32_1. Therefore, the edge second conductive layer CL2_12 connects the first conductive layer CL1_1 of the first folding line FL1 and the output third conductive layer CL32_1.

The first portion PT1_1 overlapped with the edge second conductive layer CL2_12 is disposed in the folding area FA, as shown in FIG. 5A, but it should not be limited thereto or thereby. The first portion PT1_1 overlapped with the edge second conductive layer CL2_12 may extend to the second non-folding area NFA2, and may be disposed to overlap with the output third conductive layer CL32_1. The first portion PT1_1 overlapped with the edge second conductive layer CL2_12 may extend to the first non-folding area NFA1, and may be disposed to overlap with the input third conductive layer CL31_1 in the first non-folding area NFA1.

Since the first folding line FL1 includes the first and second conductive layers CL1_1 and CL2_1, the flexibility and the conductivity of the first folding line FL1 may be improved. In more detail, since the first modulus of the first conductive layer CL1_1, which occupies most surface area of the first folding line FL1, is less than the second modulus of the second conductive layer CL2_1, flexibility, mechanical stability, and reliability of the first folding line FL1 may be improved.

In addition, since the second conductive layer CL2_1 provided to overlap with the first portions PT1_1 in the third direction DR3 may compensate a voltage drop and the open defects that may occur in the first portion PT1_1, which has a relatively small first width W1, the resistance per unit length of the first folding line FL1 may become smaller (or lower) and the conductivity of the first folding line FL1 may be improved. In particular, since the second conductive layer CL2_1 having a relatively large second modulus is disposed on a portion of the first portion PT1_1, a strain applied to each of the second conductive layers CL2_1 may be reduced, when the folding area FA is curved or bent.

The second folding line FL2 includes a first conductive layer CL1_2, second conductive layers CL2_2, and a third conductive layer. The first conductive layer CL1_2, the second conductive layers CL2_2, and the third conductive layer of the second folding line FL2 may have substantially the same structure and function as those of the first conductive layer CL1_1, the second conductive layers CL2_1, and the third conductive layer of the first folding line FL1, and thus, repeated descriptions of the substantially similar elements will be omitted to avoid obscuring exemplary embodiments described herein.

An arrangement of the first conductive layer CL1_2 and the second conductive layers CL2_2 of the second folding line FL2 is different from an arrangement of the first conductive layer CL1_1 and the second conductive layers CL2_1 of the first folding line FL1, and, thus, the arrangement of the first conductive layer CL1_2 and the second conductive layers CL2_2 of the second folding line FL2 will be mainly described.

The first conductive layer CL1_2 of the second folding line FL2 includes first portions PT1_2 and second portions PT2_2. The first portions PT1_2 are alternately arranged with the second portions PT2_2 in the first direction DR1. For example, the first portion PT1_2/the second portion PT2_2/the first portion PT1_2/the second portion PT2_2/the first portion PT1_1 are sequentially arranged in the folding area FA along the first direction DR1.

The second conductive layers CL2_2 are disposed to correspond to the first portions PT1_2 of the first conductive layer CL1_2. In more detail, the second conductive layers CL2_2 are overlapped with the first portions PT1_2 in the third direction DR3, respectively, and may not overlap the second portions PT2_2 in the third direction DR3.

The second portions PT2_2 of the second folding line FL2 may not overlap the second portions PT2_1 of the first folding line FL1 in the second direction DR2. The second portions PT2_2 of the second folding line FL2 are overlapped with the first portions of an adjacent folding lines FL1 and FL3.

At least a portion of the second portions PT2_2 of the second folding line FL2 is overlapped with at least a portion of the second portions PT2_1 of the first folding line FL1 in the second direction DR2. For example, the second portions PT2_2 of the second folding line FL2 and the second portions PT2_1 of the first folding line FL1 are overlapped with each other by an overlap length OL. In this manner, the second portions PT2_1 and PT2_2 of the first and second folding lines FL1 and FL2 have a staggered arrangement in the first direction DR1 or the second direction DR2, which may reduce a width of the bezel.

The third and fourth folding lines FL3 and FL4 have substantially the same structures as those of the first and second folding lines FL1 and FL2, respectively, and thus repeated descriptions of the third and fourth folding lines FL3 and FL4 will be omitted in order to avoid obscuring exemplary embodiments described herein.

Figure 7:
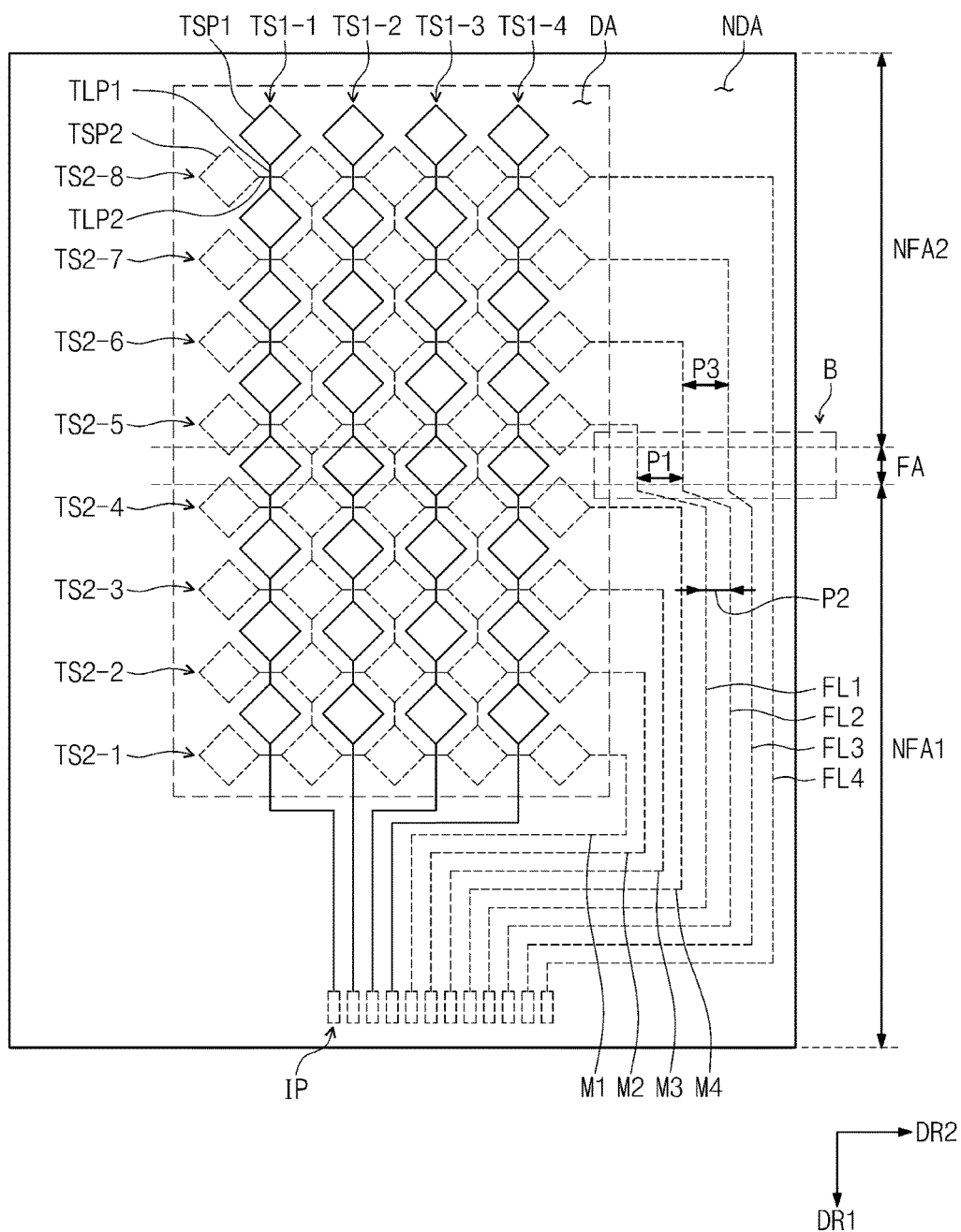
FIG. 7 is a plan view showing a touch panel according to an exemplary embodiment of the present invention.
Figure 8:
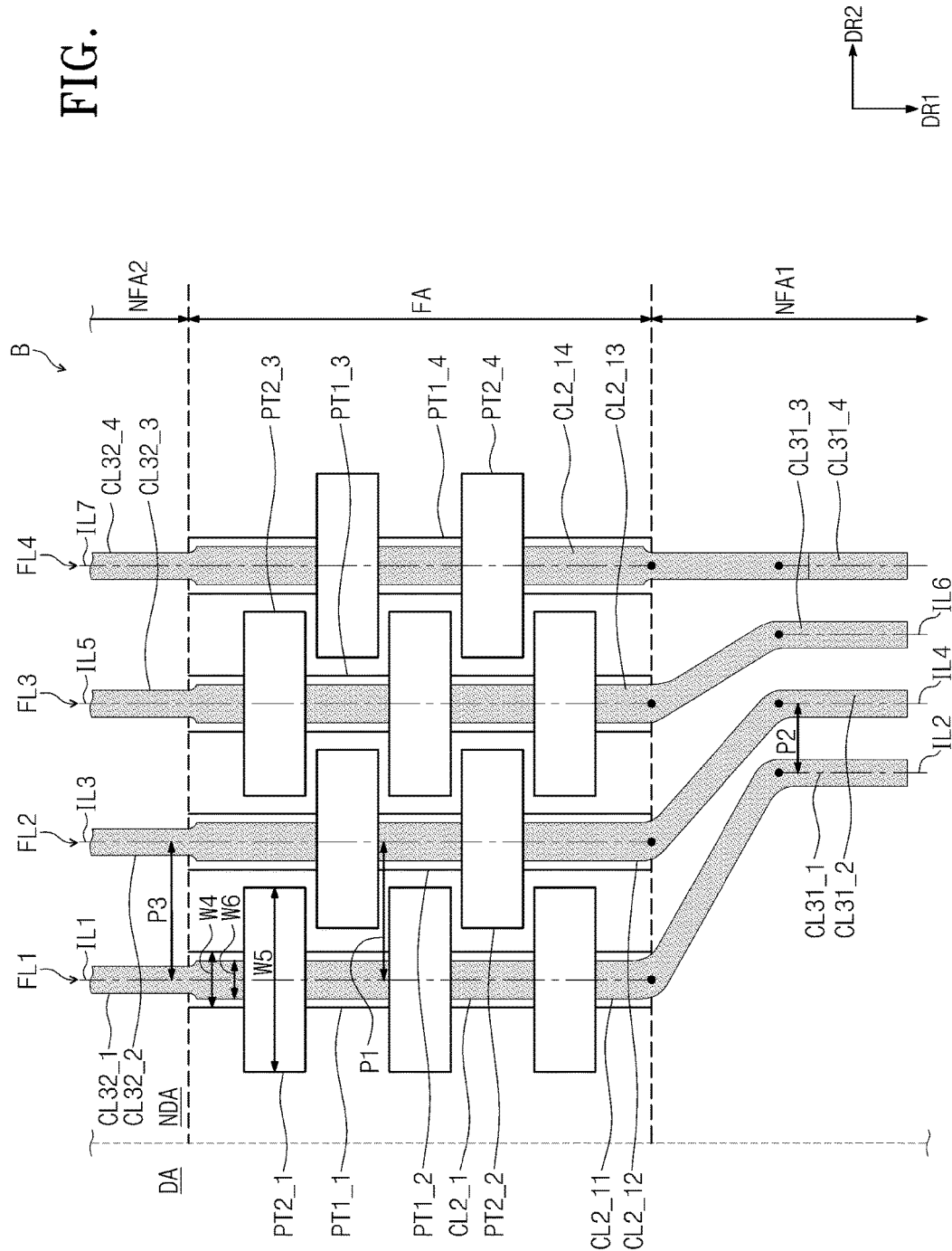
FIG. 8 is an enlarged plan view showing portion B of FIG. 7.

FIG. 7 is a plan view showing a touch panel 200 according to an exemplary embodiment of the present invention. FIG. 8 is an enlarged plan view showing portion B of FIG. 7.

Referring to FIGS. 7 and 8, a pitch between the first to fourth folding lines FL1 to FL4 in the folding area FA may be greater than a pitch between the first to fourth folding lines FL1 to FL4 in the first non-folding area NFA1. In detail, a first pitch P1 between the first portion PT1_1 of the first folding line FL1 and the first portion PT1_2 of the second folding line FL2 in the folding area FA is greater than a second pitch P2 between the input third conductive layer CL31_1 of the first folding line FL1 and the input third conductive layer CL31_2 of the second folding line FL2 in the first non-folding area NFA1. In this manner, when the first pitch P1 is greater than the second pitch P2, the width of a line in the folding area FA may be widened, and thus the conductivity of the line, the flexibility of the conductive layer, and the mechanical stability of the conductive layer may be improved.

When widths of the first portion PT1_1, the second portion PT2_1, and the second conductive layer CL2_1 of the first folding line FL1 shown in FIG. 8 are respectively referred to as fourth, fifth, and sixth widths W4, W5, and W6, the fourth, fifth, and sixth widths W4, W5, and W6 may be greater than the first, second, and third widths W1, W2, and W3 shown in FIG. 5A, respectively. In this manner, since the width of the first and second portions PT1_1 and PT2_1 becomes large, the probability of occurrence of open defects may be significantly reduced in the first and second portions PT1_1 and PT2_1, and the resistance per unit length of the first and second portions PT1_1 and PT2_1 may be substantially reduced. Similarly, the resistance per unit length of the second conductive layer may be reduced.

In FIG. 8, a third pitch P3 between the output third conductive layer CL32_1 of the first folding line FL1 and the output third conductive layer CL32_2 of the second folding line FL2 in the second non-folding area NFA2 may be substantially the same as the first pitch P1.

A center portion of the output third conductive layer CL32_1, the first portion PT1_1, and the second portion PT2_1 of the first folding line FL1 are placed on a first imaginary line ILL and a center portion of the input third conductive layer CL31_1 of the first folding line FL1 is placed on a second imaginary line IL2. The first and second imaginary lines IL1 and IL2 are substantially parallel to the first direction DR1. The first imaginary line IL1 is defined between the display area DA and the second imaginary line IL2.

An end portion of the input third conductive layer CL31_1 of the first folding line FL1 extends substantially parallel to a line connecting ends of the first and second imaginary lines IL1 and IL2, and is connected to the edge second conductive layer CL2_11 of the first folding line FL1.

A center portion of the output third conductive layer CL32_2, the first portion PT1_2, and the second portion PT2_2 of the second folding line FL2 are placed on a third imaginary line IL3, and a center portion of the input third conductive layer CL31_2 of the second folding line FL2 is placed on a fourth imaginary line IL4. The third and fourth imaginary lines IL3 and IL4 are substantially parallel to the first direction DR1. The third imaginary line IL3 is defined between the display area DA and the fourth imaginary line IL4. For example, the third imaginary line IL3 is defined between the first and second imaginary lines IL1 and IL2.

An end portion of the input third conductive layer CL31_2 of the second folding line FL2 extends substantially parallel to a line connecting ends of the third and fourth imaginary lines IL3 and IL4, and is connected to the edge second conductive layer CL2_12 of the second folding line FL2.

A center portion of an output third conductive layer CL32_3, a first portion PT1_3, and a second portion PT2_3 of the third folding line FL3 are placed on a fifth imaginary line IL5, and a center portion of an input third conductive layer CL31_3 of the third folding line FL3 is placed on a sixth imaginary line IL6. The fifth and sixth imaginary lines IL5 and IL6 are substantially parallel to the first direction DR1. The fifth imaginary line IL5 is defined between the display area DA and the sixth imaginary line IL6.

An end portion of the input third conductive layer CL31_3 of the third folding line FL3 extends substantially parallel to a line connecting ends of the fifth and sixth imaginary lines IL5 and IL6, and is connected to an edge second conductive layer CL2_13 of the third folding line FL3.

A center portion of an output third conductive layer CL32_4, a first portion PT1_4, and a second portion PT2_4 of the fourth folding line FL4 are placed on a seventh imaginary line IL7, and a center portion of an input third conductive layer CL31_4 of the fourth folding line FL4 is placed on the seventh imaginary line IL7. The seventh imaginary line IL7 is substantially parallel to the first direction DR1 and defined adjacent to the sixth imaginary line IL6 in the second direction DR2.

An end portion of the input fourth conductive layer CL31_4 of the fourth folding line FL4 extends substantially parallel to the first direction DR1, and is connected to an edge second conductive layer CL2_14 of the fourth folding line FL4.

According to exemplary embodiments, the touch panel 200 has been described an example of the flexible electronic device to which the first to fourth folding lines FL1 to FL4 are applied, and the first and second touch sensors TS1-1 to TS1-4 and TS2-1 to TS2-8 (refer to FIG. 4) have been described as an example of driven elements of the flexible electronic device. In addition, the first and second sensor patterns TSP1 and TSP2 (refer to FIG. 4) have been described as an example of driving electrodes of the driven elements.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:
1. A flexible electronic device, comprising:
a base substrate;
a first line disposed on the base substrate and extending in a first direction; and
a second line disposed on the base substrate and extending in the first direction, the first and second lines being arranged in a second direction different from the first direction, each of the first and second lines comprising:
a first conductive layer comprising first portions and second portions alternately disposed with the first portions along the first direction, the first conductive layer having a first modulus; and
second conductive layers respectively overlapped with the first portions of the first conductive layer in a third direction substantially perpendicular to the first and second directions, the second conductive layers not being overlapped with the second portions of the first conductive layer in the third direction and having a second modulus different from the first modulus,
wherein a first width in the second direction of each of the first portions of the first conductive layer is less than a second width in the second direction of each of the second portions of the first conductive layer.

2. The flexible electronic device of claim 1, wherein the first modulus is less than the second modulus.

3. The flexible electronic device of claim 1, wherein the first conductive layer has a flexibility greater than a flexibility of a second conductive layer of the second conductive layers.

4. The flexible electronic device of claim 1, wherein the resistance per unit length of the first conductive layer is greater than the resistance per unit length of a second conductive layer of the second conductive layers.

5. The flexible electronic device of claim 1, wherein a third width in the second direction of each of the second conductive layers is less than the first width.

6. The flexible electronic device of claim 1, wherein the second portions of the first conductive layer of the first line are not overlapped with the second portions of the first conductive layer of the second line in the second direction.

7. The flexible electronic device of claim 6, wherein at least a portion of the second portions of the first conductive layer of the first line is overlapped with at least a portion of the second portions of the first conductive layer of the second line in the first direction.

8. The flexible electronic device of claim 1, further comprising:
a first non-folding area configured to be not curved when an external force is applied to the base substrate;
a second non-folding area configured to be not curved when the external force is applied to the base substrate; and
a folding area interposed between the first and second non-folding areas,
wherein the first conductive layer of each of the first and second lines is disposed to correspond to the folding area.

9. The flexible electronic device of claim 8, wherein:
each of the first and second lines further comprises:
an input third conductive layer extending in the first direction and disposed in the first non-folding area; and
an output third conductive layer extending in the first direction and disposed in the second non-folding area, and
the second conductive layers comprise edge second conductive layers disposed adjacent to the first and second non-folding areas, the edge second conductive layers extending in the first and second non-folding areas and respectively connected to the input third conductive layer and the output third conductive layer.

10. The flexible electronic device of claim 9, wherein a first pitch in the second direction between the first portions of the first conductive layer of the first line and the first portions of the first conductive layer of the second line is greater than a second pitch in the second direction between the input third conductive layer of the first line and the input third conductive layer of the second line.

11. The flexible electronic device of claim 10, wherein a third pitch in the second direction between the output third conductive layer of the first line and the output third conductive layer of the second line is greater than the second pitch.

12. The flexible electronic device of claim 9, wherein:
a center portion of the first portions of the first conductive layer of the first line is disposed on a first imaginary line;
a center portion of the input third conductive layer of the first line is disposed on a second imaginary line;
a center portion of the first portions of the first conductive layer of the second line is disposed on a third imaginary line;
a center portion of the input third conductive layer of the second line is disposed on a fourth imaginary line; and
the first, second, third, and fourth imaginary lines are substantially parallel to the first direction and are sequentially defined along the second direction.

13. The flexible electronic device of claim 12, wherein:
the base substrate comprises a driven element disposed in an active area, the driven element comprising a driving electrode; and
the first imaginary line is defined between the second imaginary line and the active area.

14. The flexible electronic device of claim 13, wherein the output third conductive layer of each of the first and second lines is connected to the driven element.

15. The flexible electronic device of claim 13, wherein the input third conductive layer of each of the first and second lines is connected to an input pad disposed in the first non-folding area.

16. The flexible electronic device of claim 1, wherein the first conductive layer comprises a metal nano-wire.

17. The flexible electronic device of claim 16, wherein the first width is in a range from about 1 micrometers to about 30 micrometers.

18. The flexible electronic device of claim 1, wherein the first conductive layer has a yield strength greater than a yield strength of a second conductive layer of the second conductive layers.

19. A flexible electronic device, comprising:
a base substrate; and
a line disposed on the base substrate, the line extending in a first direction and being curved with respect to a folding axis substantially parallel to a second direction different from the first direction, the line comprising:
a first conductive layer having a first modulus, the first conductive layer comprising:
a first portion having a first width in the second direction; and
a second portion extending from the first portion in the first direction, the second portion having a second width less than the first width in the second direction; and
a second conductive layer having a second modulus different from the first modulus,
wherein the second conductive layer is overlapped with the first portion of the first conductive layer in a third direction substantially perpendicular to the first and second directions and not overlapped with the second portion of the first conductive layer in the third direction.

20. The flexible electronic device of claim 19, wherein:
the line comprises a first line and a second line; and
the second portion of the first conductive layer of the first line is not overlapped with the second portion of the first conductive layer of the second line.

21. The flexible electronic device of claim 20, wherein at least a portion of the second portion of the first conductive layer of the first line is overlapped with at least a portion of the second portion of the first conductive layer of the second line in the first direction.

* * * * *